United States Patent
Chen et al.

(10) Patent No.: US 8,481,128 B2
(45) Date of Patent: *Jul. 9, 2013

(54) LASER-BASED METHOD FOR GROWING ARRAY OF CARBON NANOTUBES

(75) Inventors: Zhuo Chen, Beijing (CN); Chun-Xiang Luo, Beijing (CN); Kai-Li Jiang, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 1113 days.

This patent is subject to a terminal disclaimer.

(21) Appl. No.: 11/982,667

(22) Filed: Nov. 2, 2007

(65) Prior Publication Data
US 2008/0220182 A1    Sep. 11, 2008

(30) Foreign Application Priority Data
Dec. 22, 2006  (CN) .......................... 2006 1 0157866

(51) Int. Cl.
*B05D 3/00*        (2006.01)
(52) U.S. Cl.
USPC ........ 427/586; 427/248.1; 427/554; 427/555; 427/78; 427/249.1
(58) Field of Classification Search
USPC .................. 427/77, 78, 108, 113, 122, 248.1, 427/249.1, 402, 554, 555, 586
See application file for complete search history.

(56) References Cited

U.S. PATENT DOCUMENTS

| | | | |
|---|---|---|---|
| 4,226,900 A * | 10/1980 | Carlson et al. | 427/228 |
| 5,154,945 A * | 10/1992 | Baldwin et al. | 427/596 |
| 6,444,400 B1 * | 9/2002 | Cloots et al. | 430/311 |
| 6,869,479 B2 * | 3/2005 | Shafeev et al. | 117/68 |
| 6,917,058 B2 | 7/2005 | Niigaki et al. | |
| 7,357,691 B2 | 4/2008 | Liu et al. | |
| 7,448,931 B2 | 11/2008 | Liu et al. | |
| 7,682,658 B2 | 3/2010 | Jiang et al. | |
| 7,771,698 B2 | 8/2010 | Chen et al. | |
| 7,780,940 B2 | 8/2010 | Chen et al. | |
| 7,820,133 B2 | 10/2010 | Chen et al. | |

(Continued)

FOREIGN PATENT DOCUMENTS
JP    2005239494 A  *  9/2005
TW    200634171      10/2006

OTHER PUBLICATIONS

Composition and Properties of Oil Well Drilling Fluids, 4th Ed., Gray and Darley, Gulf Publishing Company, 1981, p. 9.*

(Continued)

*Primary Examiner* — Katherine A Bareford
*Assistant Examiner* — James M Mellott
(74) *Attorney, Agent, or Firm* — Altis Law Group, Inc.

(57) ABSTRACT

A method for growing an array of carbon nanotubes includes the steps of: (a) providing a substrate having a first substrate surface and a second substrate surface opposite to the first substrate surface; (b) forming a catalyst film on the first substrate surface; (c) flowing a mixture of a carrier gas and a first carbon source gas over the catalyst film on the first substrate surface; (d) focusing a laser beam on the second substrate surface to locally heat the substrate to a predetermined reaction temperature; and (e) growing an array of the carbon nanotubes on the first substrate surface via the catalyst film.

20 Claims, 2 Drawing Sheets

U.S. PATENT DOCUMENTS

| | | | |
|---|---|---|---|
| 2001/0003642 A1* | 6/2001 | Chang et al. | 430/271.1 |
| 2001/0010892 A1* | 8/2001 | Mori | 430/272.1 |
| 2002/0061362 A1* | 5/2002 | Chiavarotti et al. | 427/80 |
| 2002/0160111 A1* | 10/2002 | Sun et al. | 427/248.1 |
| 2003/0130114 A1* | 7/2003 | Hampden-Smith et al. | 502/180 |
| 2004/0209385 A1* | 10/2004 | Liu et al. | 438/20 |
| 2005/0000438 A1 | 1/2005 | Lim et al. | |
| 2005/0052127 A1 | 3/2005 | Sakata et al. | |
| 2005/0113509 A1* | 5/2005 | Tazzia | 524/556 |
| 2006/0104890 A1* | 5/2006 | Harutyunyan et al. | 423/447.3 |
| 2006/0238095 A1 | 10/2006 | Nam | |
| 2006/0263524 A1 | 11/2006 | Jiang et al. | |
| 2008/0233402 A1* | 9/2008 | Carlson et al. | 428/408 |
| 2008/0268739 A1 | 10/2008 | Chen et al. | |

OTHER PUBLICATIONS

Kinghong Kwok, Wilson K.S. Chiu. "Growth of carbon nanotubes by open-air laser-induced chemical vapor deposition". Carbon, 2005, vol. 43, p. 437-446.

* cited by examiner

LASER-BASED METHOD FOR GROWING ARRAY OF CARBON NANOTUBES

RELATED APPLICATIONS

This application is related to commonly-assigned applications entitled, "LASER-BASED METHOD FOR GROWING ARRAY OF CARBON NANOTUBES", filed Nov. 2, 2007 as U.S. patent application Ser. No. 11/982,485; "LASER-BASED METHOD FOR GROWING ARRAY OF CARBON NANOTUBES", filed Nov. 2, 2007 as U.S. patent application Ser. No. 11/982,517, now U.S. Pat. No. 7,771,698; "LASER-BASED METHOD FOR GROWING ARRAY OF CARBON NANOTUBES", filed Nov. 2, 2007 as U.S. patent application Ser. No. 11/982,669, now U.S. Pat. No. 7,780,940; "LASER-BASED METHOD FOR GROWING ARRAY OF CARBON NANOTUBES", filed Nov. 2, 2007 as U.S. patent application Ser. No. 11/982,489, now U.S. Pat. No. 7,820,133, "LASER-BASED METHOD FOR MAKING FIELD EMISSION CATHODE", filed Nov. 2, 2007 as U.S. patent application Ser. No. 11/982,674, now U.S. Pat. No. 8,048,397, and "LASER-BASED METHOD FOR MAKING FIELD EMISSION CATHODE", filed Nov. 2, 2007 as U.S. patent application Ser. No. 11/982,486, now U.S. Pat. No. 8,088,454. Disclosures of the above-identified applications are incorporated herein by reference.

BACKGROUND

1. Field of the Invention

The invention relates generally to methods for growing carbon nanotubes and, particularly, to a laser-based method for growing an array of carbon nanotubes.

2. Discussion of Related Art

Carbon nanotubes (CNTs) produced by means of arc discharge between graphite rods were first discovered and reported in an article by Sumio Iijima, entitled "Helical Microtubules of Graphitic Carbon" (Nature, Vol. 354, Nov. 7, 1991, pp. 56-58). CNTs are electrically conductive along their length, chemically stable, and capable, individually, of having a very small diameter (much less than 100 nanometers) and large aspect ratios (length/diameter). Due to these and other properties, it has been suggested that CNTs can play an important role in various fields, such as microscopic electronics, field emission devices, thermal interface materials, etc.

Generally, there are three conventional methods for manufacturing CNTs. The first method is the arc discharge method, which was first discovered and reported in an article by Sumio Iijima entitled "Helical Microtubules of Graphitic Carbon" (Nature, Vol. 354, Nov. 7, 1991, pp. 56-58). The second method is the laser ablation method, which was reported in an article, by T. W. Ebbesen et al., entitled "Large-scale Synthesis of Carbon Nanotubes" (Nature, Vol. 358, 1992, pp. 220). The third method is the chemical vapor deposition (CVD) method, which was reported in an article by W. Z. Li, entitled "Large-scale Synthesis of Aligned Carbon Nanotubes" (Science, Vol. 274, 1996, pp. 1701). The CVD method is advantageously useful in synthesis of an array of carbon nanotubes and is beneficial in mass production, improved length controllability, and compatibility with conventional integrated circuit process, etc.

Generally, three main CVD methods, i.e. thermal CVD, plasma-enhanced CVD, and laser-induced CVD, have been developed for the synthesis of arrays of carbon nanotubes. In conventional laser-induced CVD method, an opaque substrate, such as silicon, is disposed with a catalyst in a closed reactor filled with reactant gases, and, typically, either an argon ion laser or $CO_2$ laser is employed to directly irradiate laser light on the substrate to heat the substrate to a reaction temperature. By locally laser-heating the substrate, carbon nanotubes can be synthesized on the substrate.

However, the above-described laser-assisted CVD method is performed in a closed reactor filled with reactant gases. Thus, the above-described method has required a complicated reaction device, and it is difficult to build and/or maintain a large-scale reactor device for CVD growth of carbon nanotubes on a large area substrate. Moreover, the newly grown carbon nanotubes tend to be directly exposed to an intense laser field, which can potentially damage the newly grown carbon nanotubes. Thus, the morphology of the obtained carbon nanotubes can be compromised. These carbon nanotubes typically do not sufficiently exhibit the useful properties desired in an array of carbon nanotubes.

What is needed, therefore, is a new laser-induced method for growing an array of carbon nanotubes that does not require a closed reactor system and that can avoid damaging the newly grown CNTs with an intense laser.

SUMMARY

A method for growing an array of carbon nanotubes includes the steps of: (a) providing a substrate having a first substrate surface and a second substrate surface opposite to the first substrate surface; (b) forming a catalyst film on the first substrate surface; (c) flowing a mixture of a carrier gas and a first carbon source gas over the catalyst film on the first substrate surface; (d) focusing a laser beam on the second substrate surface to locally heat the substrate to a predetermined reaction temperature; and (e) growing an array of the carbon nanotubes on the first substrate surface via the catalyst film.

Other advantages and novel features of the present method for growing an array of carbon nanotubes will become more apparent from the following detailed description of present embodiments when taken in conjunction with the accompanying drawings.

BRIEF DESCRIPTION OF THE DRAWINGS

Many aspects of the present method for growing an array of carbon nanotubes can be better understood with reference to the following drawings. The components in the drawings are not necessarily to scale, the emphasis instead being placed upon clearly illustrating the principles of the present method for growing an array of carbon nanotubes.

Figure 1:
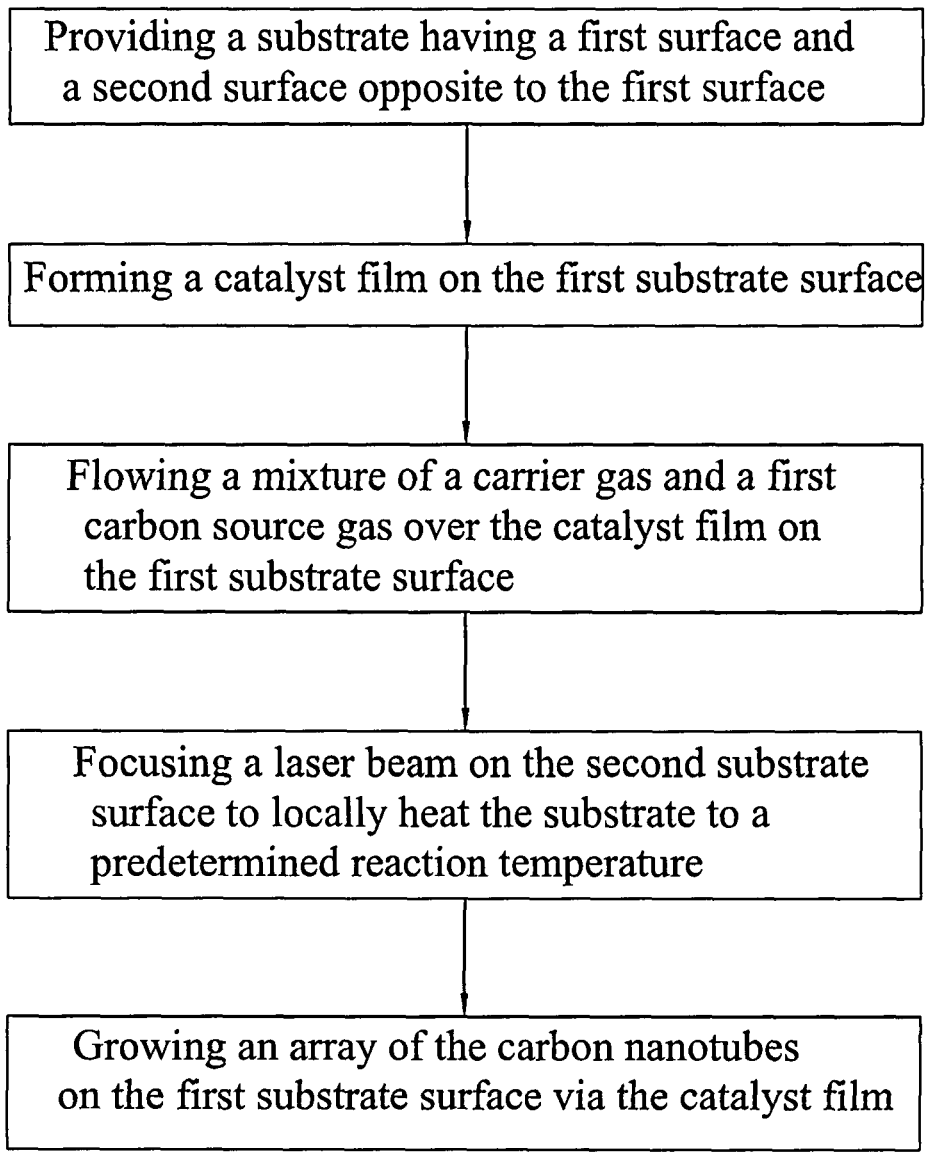
FIG. 1 is a flow chart of a method for growing an array of carbon nanotubes, in accordance with a present embodiment.

Corresponding reference characters indicate corresponding parts throughout the several views. The exemplifications set out herein illustrate at least one preferred embodiment of the present method for growing an array of carbon nanotubes, in at least one form, and such exemplifications are not to be construed as limiting the scope of the invention in any manner.

DETAILED DESCRIPTION OF PREFERRED EMBODIMENTS

Reference will now be made to the drawings to describe, in detail, embodiments of the present method for growing an array of carbon nanotubes.

Referring to FIG. 1, a method for growing an array of carbon nanotubes includes the following steps: (a) providing a substrate having a first surface and a second surface opposite to the first surface; (b) forming a catalyst film on the first substrate surface; (c) flowing a mixture of a carrier gas and a first carbon source gas over the catalyst film on the first substrate surface; (d) focusing a laser beam on the second substrate surface to locally heat the substrate to a predetermined reaction temperature; and (e) growing, via the catalyst film, an array of the carbon nanotubes on the first substrate surface.

In step (a), the substrate is, advantageously, made of a heat-resistant material (e.g., high-melting point, chemically durable), which can tolerate the high reaction temperature (e.g., upwards of about 600° C.). It is to be understood that depending on different applications, the material of the substrate could be selected from an opaque or transparent material, e.g., an opaque material such as silicon, silicon dioxide, or a metal for semiconductor electronic devices, or a transparent material such as a glass or plastic material for flat displays. When the transparent material is selected, the thickness of substrate itself does not affect the growth of carbon nanotube array, and the thickness can be chosen according to the actual applications. When the opaque material is selected, the thickness of substrate should be very thin, and, quite suitably, the thickness of substrate is less than 100 microns to facilitate rapid heat conduction.

In step (b), the catalyst film usefully is uniformly disposed on the first substrate surface by means of thermal deposition, electron-beam deposition, and/or sputtering. The catalyst is beneficially made of iron, gallium nitride, cobalt, nickel, or any combination alloy thereof. The step (b) can, subsequent to catalyst formation, further include forming oxide catalyst particles through such means as high-temperature annealing.

In step (b), when the catalyst film includes the first carbonaceous/carbonous material, the method for making the catalyst film includes the substeps of: (b1) providing a mixture of a dispersant and a first carbonaceous material; (b2) combining the mixture with a solvent to form a solution; (b3) ultrasonically agitating the solution to promote the dispersion of the first carbonaceous material therein; (b4) adding a soluble catalyst material into the dispersed solution to form a catalyst solution; (b5) coating the catalyst solution on the first substrate surface; and (b6) baking the substrate to form thereon a catalyst film that includes the first carbonaceous material.

In step (b1), the first carbonaceous material can usefully be selected from carbon black (CB) and/or graphite. The dispersant is used for uniformly dispersing the first carbonaceous material. Quite suitably, the dispersant is sodium dodecyl benzene sulfonate (SDBS). A weight ratio of the dispersant to the first carbonaceous material is, advantageously, in the approximate range from 1:2 to 1:10. In step (b2), the solvent is, opportunely, water or ethanol. In one useful embodiment, an amount of SDBS in the range of about 0~100 mg (beneficially, a measurable amount of dispersant (i.e., above about 0 mg) is employed) and an amount of CB of about 100~500 mg are mixed into a volume of ethanol of about 10~100 ml to form the solution. Quite usefully, the solution is formed by combining about 50 mg of SDBS and about 150 mg of CB into about 40 ml of ethanol.

In step (b3), the solution can be sonicated (i.e., subjected to ultrasound) for, e.g., about 5 to 30 minutes to uniformly disperse/mix the first carbonaceous material in the solution. In step (b4), the soluble catalyst material can, rather appropriately, include one or more metallic nitrate compounds selected from a group consisting of magnesium nitrate (Mg$(NO_3)_2.6H_2O$), iron nitrate (Fe$(NO_3)_3.9H_2O$), cobalt nitrate (Co$(NO_3)_2.6H_2O$), nickel nitrate (Ni$(NO_3)_2.6H_2O$), and any combination thereof. In one useful embodiment, after being treated with ultrasound for about 5 minutes, Fe$(NO_3)_3.9H_2O$ and Mg$(NO_3)_2.6H_2O$ is added to the solution, thereby forming the catalyst solution. Quite usefully, the catalyst solution includes about 0.01~0.5 Mol/L magnesium nitrate and about 0.01~0.5 Mol/L iron nitrate.

In step (b5), the catalyst solution is, beneficially, spin coated on the substrate at a rotational speed of about 1000~5000 rpm. Quite suitably, the rotational speed for spin coating is about 1500 rpm. In step (b6), the substrate, with the catalyst solution coated thereon, is baked at about 60~100° C. for 10 min~1 hr. It is to be understood that the baking process is used to vaporize the solvent in the solution and accordingly form the catalyst film on the first substrate surface, with the catalyst film thereby containing the first carbonaceous material.

A step (f) of forming a light absorption film can be further provided before step (b), and, accordingly, the catalyst film is formed on the light absorption material deposited on the first substrate surface. Step (f) further includes the substeps of: (f1) applying a second carbonaceous material layer onto the first substrate surface; (f2) gradually heating the substrate with the second carbonaceous material layer thereon for about 60~90 minutes to about 300~450° C. in $N_2$ and/or noble gas atmosphere; (f3) baking the substrate with the second carbonaceous material for about 15~20 minutes; and (f4) cooling down the substrate with the second carbonaceous material thereon to room temperature and forming a light absorption layer on the first substrate surface.

In step (f1), the second carbonaceous material layer is advantageously made of materials having merits of good electrical conductivity, strong adhesion with the substrate, and compatibility with a high vacuum environment. Quite usefully, the second carbonaceous material is commercial colloidal graphite, as used for CRTs. The second carbonaceous material can, beneficially, be spin-coated on the first substrate surface at a rotational speed of about 1000~5000 rpm. Quite suitably, the rotational speed for spin coating is about 1500 rpm. In step (f2), the baking process is, at least in part, to eliminate any impurities in the second carbonaceous material layer, such as any macromolecular material in the commercial graphite inner coating (GIC). The thickness of the formed light absorption layer is in the approximate range from 1 to 20 micrometers.

Step (b) further incorporates the steps of: (b7) providing a catalyst ethanol solution; and (b8) coating the catalyst ethanol solution on the GIC layer to form the catalyst film.

In step (b7), the catalyst can, opportunely, be made of iron, gallium nitride, cobalt, nickel, or any combination alloy thereof. In step (b8), in one useful embodiment, a catalyst-ethanol solution is spin-coated (~1500 rpm) on the GIC layer to form the film of catalyst. The catalyst-ethanol solution is a mixture solution of ethanol and one or more metallic nitrate compounds selected from a group consisting of magnesium nitrate (Mg$(NO_3)_2.6H_2O$), iron nitrate (Fe$(NO_3)_3.9H_2O$), cobalt nitrate (Co$(NO_3)_2·6H_2O$), nickel nitrate (Ni$(NO_3)_2·6H_2O$), and any combination thereof. Quite usefully, the catalyst ethanol solution includes about 0.01~0.5 Mol/L magnesium nitrate and about 0.01~0.5 Mol/L iron nitrate. The thickness of the formed catalyst film is in the approximate range from 1 to 100 nanometers.

In step (c), the carbon source gas acts as a primary source of carbon for growing the carbon nanotubes. In one useful embodiment, the carbon source gas and the carrier gas are directly introduced, in open air, by a nozzle to an area adjacent to the catalyst film. That is, the method can be operated without a closed reactor and/or without being under a vacuum. The carrier gas can, beneficially, be nitrogen ($N_2$) and/or a noble gas. The carbon source gas can, advantageously, be ethylene ($C_2H_4$), methane ($CH_4$), acetylene ($C_2H_2$), ethane ($C_2H_6$), or any combination thereof. Quite suitably, the carrier gas is argon (Ar), and the carbon source gas is acetylene. A ratio of the carrier gas flow-rate to the carbon source gas flow-rate is, opportunely, adjusted to be in an approximate range from 5:1 to 10:1. Quite usefully, the argon flow-rate is 200 sccm (Standard Cubic Centimeter per Minute), and the acetylene flow-rate is 25 sccm.

In step (d), the laser beam can be generated by a laser beam generator (e.g., a carbon dioxide laser, an argon ion laser, etc.). A power of the laser beam generator is in the approximate range from above about 0 W (Watt) (i.e., a measurable amount of power) to ~5 W. Quite usefully, a carbon dioxide laser of 470 mW is used for generating the laser beam. The laser beam generator further includes at least one lens for focusing laser beams generated by the laser beam generator. On account of the transparent substrate or the opaque substrate is very thin, it is to be understood that the focused laser beam could be employed to irradiate directly on the second substrate surface, and the substrate could transfer the heat to the catalyst film. The transferred heat would quickly heat the catalyst to a predetermined temperature along a direction vertical/orthogonal or oblique to the substrate (i.e., the surface of the substrate upon which the array is grown). The heat transfer direction/angle would depend upon such factors as the beam angle relative to the substrate and the crystallography and/or morphology of the substrate. As a result of such various operating parameters, the method can be operated in open air without heating the entire substrate to meet a reaction temperature for synthesizing carbon nanotubes.

In step (d), due to the fact that the focused laser beam is irradiated on the second substrate surface, laser-intensity-induced damage to the newly grown CNTs on the first surface side of the substrate can thereby be effectively avoided. Moreover, the laser beam will not directly react with the carbon source gas nor have an impact on any of the properties of the gas. Thus, the laser beam cannot undermine the growth of carbon nanotubes arrays.

In step (e), due to catalyzing by the catalyst film, the carbon source gas supplied over the catalyst film is pyrolyzed in a gas phase into carbon units (C=C or C) and free hydrogen ($H_2$). The carbon units are absorbed on a free surface of the catalyst film and diffused thereinto. When the catalyst film becomes supersaturated with the dissolved carbon units, carbon nanotube growth is initiated. As the intrusion of the carbon units into the catalyst film continues, an array of carbon nanotubes is formed. The additional hydrogen produced by the pyrolyzed reaction can help reduce the catalyst oxide and thus activate the catalyst. As such, the growth speed of the carbon nanotubes is increased, and the achievable height of the array of the carbon nanotubes is enhanced.

It is noted that the first carbonaceous material in the catalyst film or the light absorption film employed in the method has the following virtues. Firstly, the first carbonaceous material and/or the light absorption film will absorb laser light and thus facilitate heating of the catalyst to enable carbon nanotube growth. Secondly, the carbonaceous material will release carbon atoms to promote the nucleation of carbon nanotubes, when irradiated by a given laser beam. Finally, because of the initial presence of the carbon in the catalyst film, the supersaturation point for carbon therein will be reached sooner, permitting carbon nanotube growth to start sooner than might otherwise be possible. As such, the predetermined temperature for locally heating the catalyst film by laser beam can be less than ~600° C.

Figure 2:
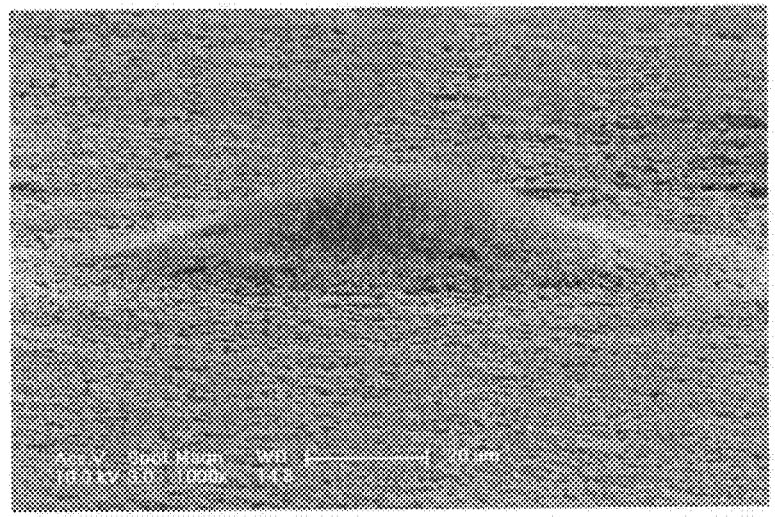
FIG. 2 shows a Scanning Electron Microscope (SEM) image of the array of carbon nanotubes grown by the method of FIG. 1, wherein the catalyst film includes the first carbonaceous material.

Referring to FIG. 2, an array of carbon nanotubes manufactured by the present method is shown, wherein the catalyst film includes the first carbonaceous material. The array of carbon nanotubes is synthesized by irradiating the focused laser beam on the second substrate surface for about 5 seconds. A diameter of the focused laser beam is in the approximate range from 50 to 200 micrometers. The formed array of carbon nanotubes, in this example, manifests a hill-shaped. The diameter of the hill is in the approximate range from 50 to 80 micrometers. The maximum height of the hill is in the approximate range from 10 to 20 micrometers. The diameter of each carbon nanotube is in the approximate range from 40 to 80 nanometers.

Figure 3:
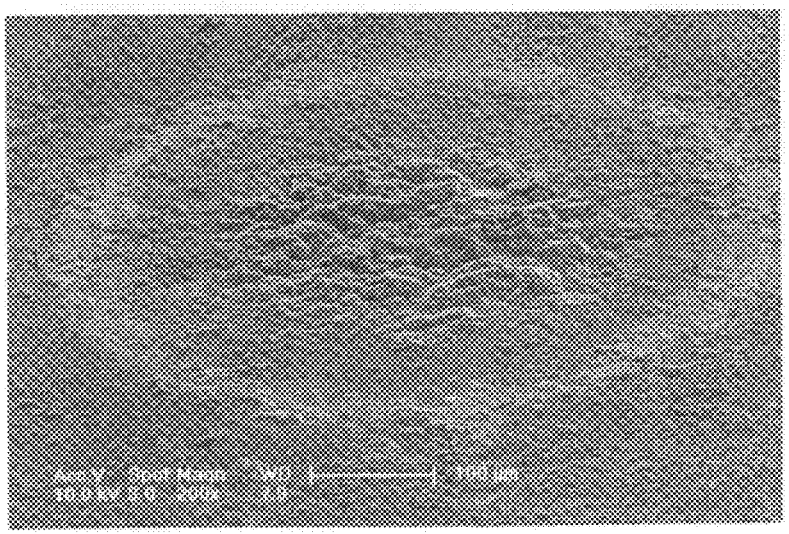
FIG. 3 shows a Scanning Electron Microscope (SEM) image of the array of carbon nanotubes grown by the method of FIG. 1, wherein a light absorption film is further provided, and the catalyst film is formed thereon.

FIG. 3 shows an array of carbon nanotubes manufactured by the present method, wherein a step (f) of forming a light absorption film on the first substrate surface is further provided before step (b), and the catalyst film is formed thereon. The array of carbon nanotubes is synthesized by irradiating the focused laser beam on the second surface of substrate for about 30 seconds. A diameter of the focused laser beam is in the approximate range from 50 to 200 micrometers. The formed array of carbon nanotube, in this example, manifests a hill-shaped. The diameter of the hill is in the approximate range from 100 to 200 micrometers. The maximum height of the hill is in the approximate range from 10 to 20 micrometers. The diameter of each carbon nanotube is in the approximate range from 10 to 30 nanometers.

It is noted that the present method can synthesize a large area array of carbon nanotubes by scanning the laser beam on a large area substrate and that the properties of carbon nanotubes thus produced are able to be closely controlled and thereby be essentially uniform.

Compared with conventional CVD methods for growing carbon nanotube arrays, the methods in the described present embodiments employ a focused laser beam, which irradiates on the second substrate surface. Such laser beam usage can effectively avoiding damaging, by intense laser, the newly grown CNTs on the first surface side of the substrate. Moreover, the laser beam will not directly react with the carbon source gas and will not have an impact on the properties of the gas. Thus, the laser beam will not undermine the growth of carbon nanotubes arrays.

Furthermore, the methods in the described present embodiments employ a first carbonaceous material in the catalyst film and/or a light absorption film, thereby providing the following virtues not found in conventional CVD growth methods. Firstly, the first carbonaceous material and/or the light absorption film will absorb laser light and thus facilitate heating of the catalyst to enable carbon nanotube growth. Secondly, the carbonaceous material will release carbon atoms to promote the nucleation of carbon nanotubes, when irradiated by laser beam. Finally, because of the initial presence of the carbon in the catalyst film, the supersaturation point for carbon therein will be reached sooner, permitting carbon nanotube growth to start earlier than might otherwise be possible. As such, the predetermined temperature for locally heating the catalyst film by laser beam can be less than ~600° C. Moreover, the present method for growing arrays of carbon nanotubes can proceed in open air, without a closed reactor and/or vacuum conditions. Furthermore, the present method can synthesize large area arrays of carbon nanotubes by scanning the laser beam on the catalyst. For all of the various reasons provided, the operation of the present method is relatively simple, and the resultant cost thereof is reasonably low, compared to conventional methods.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method for growing an array of carbon nanotubes, comprising the steps of:
   (a) providing an opaque substrate having a first substrate surface and a second substrate surface opposite to the first substrate surface, wherein the opaque substrate is opaque at a wavelength of a laser beam of a laser;
   (b) forming a catalyst film on the first substrate surface;
   (c) flowing a mixture of a carrier gas and a carbon source gas over the catalyst film on the first substrate surface;
   (d) focusing the laser beam of the laser at the wavelength to which the opaque substrate is opaque on first predetermined points of the second substrate surface, wherein heat is generated on the second substrate surface and transferred through the substrate, to locally heat second predetermined points of the second substrate surface to a predetermined temperature; and
   (e) growing an array of carbon nanotubes on each of the second predetermined points, via the catalyst film, on the first substrate surface.

2. The method as claimed in claim 1, wherein the substrate comprises at least one material selected from the group consisting of silicon, silicon dioxide, and a metal.

3. The method as claimed in claim 1, wherein a thickness of the substrate is less than 100 micrometers.

4. The method as claimed in claim 1, wherein step (b) further comprises the substeps of:
   (b1) providing a mixture of a dispersant and a first carbonaceous material;
   (b2) combining the mixture with a solvent to form a solution;
   (b3) ultrasonically agitating the solution to promote dispersing of the first carbonaceous material therein;
   (b4) adding a soluble catalyst material into the dispersed solution to form a catalyst solution;
   (b5) coating the catalyst solution on the first substrate surface; and
   (b6) baking the substrate to form a catalyst film thereon, the catalyst film including the first carbonaceous material therein.

5. The method as claimed in claim 4, wherein in step (b1), the first carbonaceous material comprises at least one of carbon black and graphite, and the dispersant comprises sodium dodecyl benzene sulfonate.

6. The method as claimed in claim 4, wherein in step (b1), a weight ratio of the dispersant to the first carbonaceous material is in the approximate range from 1:2 to 1:10.

7. The method as claimed in claim 4, wherein in step (b4), the soluble catalyst material comprises a mixture of magnesium nitrate and at least one material selected from the group consisting of iron nitrate, cobalt nitrate, and nickel nitrate.

8. The method as claimed in claim 4, wherein in step (b2), the solvent comprises at least one of water and ethanol.

9. The method as claimed in claim 1, wherein a thickness of the catalyst film is in the approximate range from 10 to 100 micrometers.

10. The method as claimed in claim 1, wherein a further step of forming a light absorption film is further provided before step (b), and the catalyst film is formed on the light absorption material on the first substrate surface.

11. The method as claimed in claim 10, wherein the step of forming the light absorption film further comprises the substeps of:
    (f1) applying a second carbonaceous material onto the first substrate surface;
    (f2) gradually heating the carbonaceous material to 300° C.~450° C. within 60~90 minutes in nitrogen and/or noble gas atmosphere;
    (f3) baking the second carbonaceous material; and
    (f4) cooling down the second carbonaceous material to room temperature and forming the light absorption film on the first substrate surface.

12. The method as claimed in claim 11, wherein in step (f1), the second carbonaceous material comprises colloidal graphite.

13. The method as claimed in claim 12, wherein in step (f1), a layer of the second carbonaceous material is formed on the first substrate surface by spin coating.

14. The method as claimed in claim 10, wherein a thickness of the light absorption film is in the approximate range from 1 to 20 micrometers.

15. The method as claimed in claim 10, wherein step (b) further comprises the substeps of:
    (b7) providing a catalyst solution;
    (b8) coating the catalyst solution on the light absorption film; and
    (b9) baking the catalyst solution to form thereon a film of catalyst.

16. The method as claimed in claim 15, wherein the catalyst solution is a mixture solution of ethanol and metallic nitrate compounds.

17. The method as claimed in claim 16, wherein the metallic nitrate compounds are selected from a group consisting of magnesium nitrate, iron nitrate, cobalt nitrate, nickel nitrate and any combination thereof.

18. The method as claimed in claim 1, wherein a diameter of the laser beam is in the approximate range from 50 to 200 micrometers.

19. The method as claimed in claim 1, wherein a thickness of the catalyst film is in the approximate range from 1 to 100 nanometers.

20. The method as claimed in claim 1, wherein the array of carbon nanotubes form a raised feature on the first substrate surface and ends of the array of carbon nanotubes grown on each of the second predetermined points form an arc-shaped surface.

* * * * *